United States Patent [19]

Bilakanti et al.

[11] Patent Number: 4,923,564
[45] Date of Patent: May 8, 1990

[54] SELECTIVE ETCHING PROCESS

[75] Inventors: Jaya Bilakanti, Teaneck; Edward J. Laskowski, Scotch Plains, both of N.J.

[73] Assignee: American Telephone and Telegraph Company, New York, N.Y.

[21] Appl. No.: 398,116

[22] Filed: Aug. 24, 1989

[51] Int. Cl.$^5$ .................. H01L 21/306; B44C 1/22; C03C 15/00; C03C 25/06
[52] U.S. Cl. .................. 156/655; 156/656; 156/659.1; 156/662; 252/79.2
[58] Field of Search ............... 156/647, 654, 655, 656, 156/659.1, 662; 252/79.1, 79.2, 79.4; 437/126, 129, 234; 357/16, 17, 19

[56] References Cited

U.S. PATENT DOCUMENTS 4,049,488  9/1977  Tijburg ..................... 156/655

OTHER PUBLICATIONS

GaAs-GaAlAs Heterojunction Transistor for High Frequency Operation, by W. P. Dumke, et als, *Solid-State Electronics*, 1972, vol. 15, pp. 1339-1343.
Selective Etching Characteristics of HF for $Al_xGa_{1-x}As/GaAs$, by X.S.Wu, *Electronic Letters*, 21, 588 (1985).
Extreme Selectivity in the Lift-Off of Epitaxial GaAs Films, by E. Yablonovitch, et als, *Appl. Phys. Lett.* 51, (26), Dec. 28, 1987, pp. 2222-2224.
The Etching of $Ga_{0.7}Al_{0.3}As$ Using $KI-I_2$, by A. C. Wismayer, et al., *Materials Letters*, May 1988, vol. 6, No. 8.9, pp. 284-286.
Chemical Etching of (100) GaAs in the $(NH_4)_2Cr_2O_7-H_2SO_4Cl-H_2O$ System, by I. Barycka, et al., *Journal of Material Science* 21, (1986), pp. 2153-2158.
A New Etchant System, $K_2CO_2O_7-H_2SO_4-HCl$ for GaAs and InP, by S. Adachi, et al., *Journal of Materials Science* 16, (1981), pp. 2449-2456.
Defect-Selective Etching of GaAs in $CrO_3-HCl$ Solutions, by J. van de Ven, et al., *Chemtronics*, 1986, vol. 1, Mar., pp. 19-26.
The Mechanism of GaAs Etching in $CrO_3-HF$ Solutions, by J. van de Ven, et als, *Journal of Electrochemical Society*, 132, p. 3020 (1985).
Chemical Etching of GaAs, by S. Adach, et al., *Journal of the Electrochemical Society:Solid State Science and Technology*, 131, No. 1, pp. 126-130 (1984).

Primary Examiner—William A. Powell
Attorney, Agent, or Firm—Walter G. Nilsen

[57] ABSTRACT

An etching process is described for etching aluminum containing III-V semiconductor compounds. The etch solution contains dichromate ion in acid aqueous solution in which the acid is either phosphoric acid or sulfuric acid. The etch solution is highly selective in that it etches the aluminum containing III-V semiconductor compounds without etching significantly other III-V semiconductor compounds not containing aluminum exposed to the same etching solution. the etching process is extremely useful in fabricating a variety of III-V semiconductor devices including heterojunction bipolar transistors, heterojunction field effect transistors and self-enhanced electro optic devices.

9 Claims, 1 Drawing Sheet

SELECTIVE ETCHING PROCESS

FIELD OF THE INVENTION

The invention relates to a process for fabricating semiconductor devices. In particular, it relates to an etching process used in the fabrication of semiconductor devices.

BACKGROUND OF THE INVENTION

Great advancements have been made in semiconductor technology in the last few years largely due to the discovery of new materials and the discovery of new methods of making better materials. These advances have led to new device applications for semiconducting materials and such applications often require different fabrication techniques. Typically, these techniques are aimed toward obtaining smaller size, more precise location of various geometrical features in the device, more accurate shapes for various geometrical features in the structure, greater adherence of metallic substances to the semiconductor surfaces, etc.

An important aspect of semiconductor fabrication technology is etching procedures and solutions. Etching solutions should be stable, have predictable rates and produce uniform etching rates over wide areas of a semiconductor wafer. A particularly important problem in the fabrication of many III-V semiconductor devices is the uniform etching of layers (generally epitaxial layers) of aluminum containing III-V semiconductor compounds (e.g. aluminum gallium arsenide, aluminum indium arsenide, etc.). Such compounds often exhibit problems both as to the stability of the etching solution and uniformity of the etch rate across the semiconductor wafer. In addition, in the fabrication of many devices, it is highly advantageous to selectively etch one semiconductor (e.g. an aluminum containing semiconductor compound) without etching (or etching only to a small extent) another semiconductor compound.

A particular case in point is the development of a variety of heterojunction devices involving different III-V semiconducting compounds. A typical example is heterojunction devices featuring aluminum gallium arsenide and gallium arsenide. The inclusion of the aluminum is done for a variety of reasons including altering the band gap, providing lattice matching to another III-V semiconductor compound, improve etch unformity and changing optical properties of the semiconductor.

In fabricating such devices, it is highly desirable to be able to selectively etch one III-V semiconductor compound without etching the other semiconductor compound. For example, in fabricating various gallium arsenide heterojunction devices, it is often highly desirable to etch aluminum gallium arsenide selectively without etching the gallium arsenide. In many device fabrication procedures, it is desirable that such selective etching be effective even for very low aluminum contents. Often, this is desirable because crystal morphology is easily degraded with high aluminum content material. Also, various electronic properties change as aluminum content increases beyond 20 or 30 mole percent.

A variety of references describe etching solutions and processes for III-V semiconductor compounds. Particularly noteworthy is U.S. Pat. No. 4,049,488 issued on Sept. 20, 1977 to R. P. Tigburg. This reference describes selective etching of aluminum gallium arsenide in the presence of gallium arsenide using various redox systems at specific pH valves. Also described is selective etching of gallium arsenide in the presence of aluminum gallium arsenide.

Other references also describe etching of gallium aluminum arsenide including "GaAs-GaAlAs Heterojunction Transistor for High Frequency Operation" by W. P. Dumke et al, *Solid State Electronics*, 1972, Volume 15, pp. 1339-1343; "Selective Etch Characteristics of HF for $Al_xGa_{1-x}As/GaAs$", by X. S. Wu et al, *Electronic Letters*, 21, 558 (1985), "Extreme Selectivity in the Lift-Off of Epitaxial GaAs Films", by Eli Yablonovitch et al, *Applied Physics Letters*, Volume 51, No. 26 (1987); and "The Etching of $Ga_{0.7}Al_{0.3}As$ Using $KI-I_2$" by A. C. Wismayer et al, *Materials Letters*, Volume 6, page 284-286 (1988).

Aqueous dichromate ion solutions have been used in etching III-V semiconductor compounds in a number of references including "Chemical Etching of (100) GaAs in the $(NH_4)_2Cr_2O_7$—$H_2SO_4$—$NH_4Cl$—$H_2O$ Systems", by I. Barycka et al, *Journal of Material Science* 21 (1986) 2153-2158; "A New Etchant System, $K_2Cr_2O_7$—$H_2SO_4$—HCl, for GaAs and InP" by S. Adachi et al, *Journal of Materials Science* 16, 2449-2456 (1981); "Defect Selective Etching of GaAs in $CrO_3$—HCl Solutions" by J. van de Ven et al, *Chemtronics*, 1986, Vol. 1, March, pp. 19-26; "The Mechanism of GaAs Etching in $CrO_3$—HF Solutions" by J. van de Ven et al, *Journal of the Electrochemical Society*, 132, 3020 (1985) and "Chemical Etching on GaAs" by S. Adachi et al, *Journal of the Electrochemical Society: Solid-State Science and Technology* 131, No. 1, pp. 126-130 (1984)

SUMMARY OF THE INVENTION

The invention is a process for fabricating a device, said device comprising an aluminum containing III-V semiconductor compound in which the aluminum containing III-V semiconductor compound is etched using an acidic dichromate solution. The amount of aluminum in the III-V semiconductor may vary over large limits, typically from 5 mole percent to 100 mole percent and is usually determined by the device application rather than the performance of the etch solution. The concentration of dichromate ion ($Cr_2O_7^=$) may vary over large limits including 0.0001M to saturation but concentrations from 0.001M to 0.5M yield excellent etch rates.

Various acids may be used in the practice of the invention. Preferred are sulfuric acid and phosphoric acid with phosphoric acid most preferred. Acid concentrations may vary over large limits including 0.01M to 10M but best results are obtained in the range from 0.25M to 10M. Typical aluminum containing III-V compounds are aluminum gallium arsenide, aluminum indium arsenide and aluminum arsenide.

An extremely important aspect of the invention is the selectivity of the etching process for etching aluminum-containing III-V semiconductor compounds without etching significantly non-aluminum containing III-V semiconductor compounds. Particularly important is etching aluminum gallium arsenide in the presence of gallium arsenide and etching aluminum indium arsenide in the presence indium gallium arsenide (typically in an indium phosphide device). Selectivity (ratio of etch rates for aluminum compound and non-aluminum compound) varies with dichromate ion concentration and acid concentration. Useful selectivity is obtained for dichromate ion concentrations from 0.001M to 0.5 and acid concentrations from 0.1M to 10M, with 2-10 molar preferred. Both sulfuric acid and phosphoric acid yield useful selectivity with phosphoric acid most preferred. A variety of devices are usually made using this etch process including heterojunction bipolar transistors, (HBT), heterojunction field effect transistors (HFET) and self-enhanced electro optic devices (SEED).

DETAILED DESCRIPTION

The invention is based on the discovery that acidic dichromate solution is an extremely convenient and effective etch solution for aluminum containing III-V semiconductor compounds and that this etch, particularly when phosphoric acid is used as the acid, shows a high degree of selectivity when the etching process is carried out in the presence of non aluminum containing III-V semiconductor compounds. Typical examples are the etching of aluminum gallium arsenide in the presence of gallium arsenide and the etching of aluminum arsenide (e.g. $In_{0.53}Al_{0.47}As$) in the presence of indium gallium arsenide (e.g. $In_{0.53}Ga_{0.47}As$). Highly advantageous is the large range of aluminum content in the III-V semiconductor compound that can be etched using this process. For example, aluminum contents as low as 5 mole percent are etched by the etch solution with good etch rates and excellent selectivity. Aluminum content may vary from 5 mole percent or 10 mole percent to 100 mole percent (AlAs) with excellent results. Indeed, one of the major advantages of this etch system is that it can selectively etch very low aluminum content aluminum gallium arsenide in the presence of gallium arsenide which is required in fabricating a variety of devices. Applications are numerous largely because of the extensive use of aluminum gallium arsenide in gallium arsenide devices and the use of aluminum indium arsenide in indium gallium arsenide-indium phosphide devices.

Figure 1:
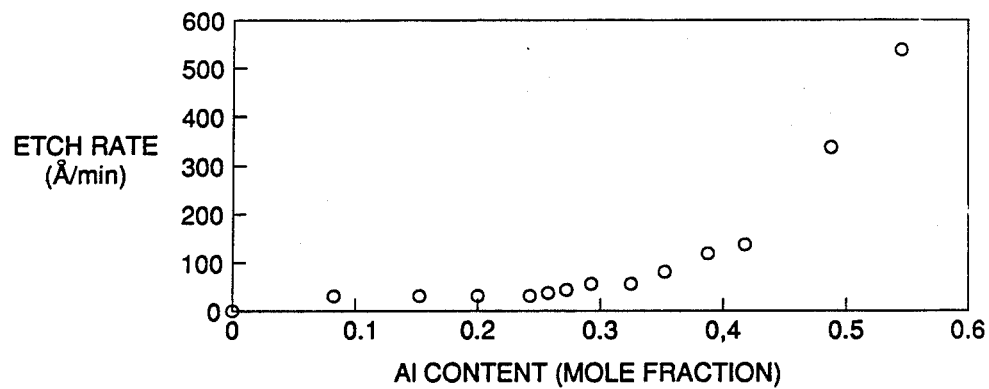
FIG. 1 shows in graphical form data on etch rate as a function of aluminum content in aluminum gallium arsenide for an etch solution of 0.06 molar $K_2Cr_2O_7$ in 7 molar phosphoric acid.
Figure 2:
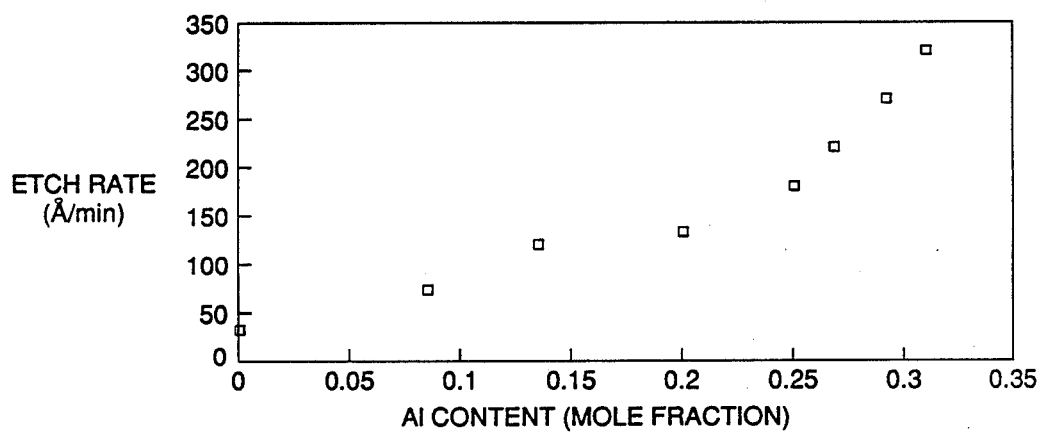
FIG. 2 shows a similar graph to FIG. 1 for an etch solution of 0.0068M $K_2Cr_2O_7$ in 7 molar phosphoric acid.

The data shown in Table 1 and FIGS. 1 and 2 represent examples of individual etch experiments and show the great versatility of this etching solution.

The etch solution is made up by conventional means. Generally, a source of dichromate is added to the aqueous acid (e.g. phosphoric acid or sulfuric acid). Any source of dichromate ion may be used including an alkali-metal dichromate (e.g. $K_2Cr_2O_7$) and ammonium dichromate. Also, mixtures of sulfuric acid and phosphoric acid may be used in the practice of the invention.

A large number of examples were carried out and the resulting data given below in graphical form and in tabular form. The experiments were carried out by immersing the samples in etching solution at room temperature. Room temperature is used as a matter of convenience. Other temperatures are useful typically from the freezing point of the solution to the boiling point of the solution. Also, etch rate can be adjusted by varying the temperature of the etch solution.

FIG. 1 shows some etch rate data of an acid dichromate solution in graphical form. The plot shows Etch Rate in Angstroms/minute as a function of aluminum content (as mole fraction) in the III-V semiconductor compound $Al_xGa_{1-x}As_x$ in a 0.06 molar $K_2Cr_2O_7$ in 7 molar $H_3PO_4$. Notice the extremely low etch rate for pure gallium arsenide and the extremely high selectivity of the etch solution.

FIG. 2 shows a similar plot for a different etch solution composition, namely 0.0068M $K_2Cr_2O_7$ in 7 molar $H_3PO_4$. Here, etch rates are somewhat higher but selectivity not as great. By proper adjustment of the composition of the acid dichromate solution, the etch rate and selectivity can be tailored to particular needs and compositions.

Table 1 shows further data on etch rate and selectivity as a function of acid concentration and dichromate concentration. Here, etch rate for the compound $Al_{0.35}Ga_{0.65}As$ and selectivity for $Al_{0.35}As$ in the presence of GaAs is shown for a variety of phosphoric acid concentrations and dichromate ion concentrations.

Etch rate is shown in terms of depth etched in 30 minutes in $Al_{0.35}Ga_{0.65}As$ and selectivity in terms of depth etched in $Al_{0.35}Ga_{0.65}As$ in 30 minutes divided by depth etched in GaAs in 30 minutes.

TABLE I

Etch rate and Selectivity as a Function of Dichromate and Acid Concentrations for $Al_{0.35}Ga_{0.65}As$ in the Presence of GaAs.

| Dichromate Conc. (Molar) | Acid Conc. (Molar) | Etch Rate (Å/30 min) | Selectivity |
|---|---|---|---|
| 0.0068 | 0.5 | 2391 | 16 |
| 0.0068 | 1.0 | 4653 | 11 |
| 0.0068 | 1.5 | 8802 | 15 |
| 0.0017 | 2.0 | 16989 | 11 |
| 0.0034 | 2.0 | 13968 | 12 |
| 0.0051 | 2.0 | 12774 | 18 |
| 0.0068 | 2.0 | 9894 | 12 |
| 0.010 | 2.0 | 7314 | 12 |
| 0.014 | 2.0 | 6480 | 20 |
| 0.017 | 2.0 | 4894 | 9 |
| 0.026 | 2.0 | 3538 | 17 |
| 0.034 | 2.0 | 2781 | 12 |
| 0.05 | 2.0 | 1928 | — |
| 0.06 | 2.0 | 1789 | 29 |
| 0.068 | 2.0 | 1555 | — |
| 0.0068 | 3.0 | 20442 | 14 |
| 0.0051 | 4.0 | 20550 | 14 |
| 0.0068 | 4.0 | 18192 | 15 |
| 0.017 | 4.0 | 12942 | 15 |
| 0.034 | 4.0 | 5949 | 18 |
| 0.05 | 4.0 | 3822 | 25 |
| 0.06 | 4.0 | 3659 | 27 |
| 0.068 | 4.0 | 2550 | 34 |
| 0.085 | 4.0 | 1965 | 39 |
| 0.1 | 4.0 | 1978 | 40 |
| 0.0034 | 6.0 | 12930 | 4 |
| 0.0051 | 6.0 | 28110 | 17 |
| 0.0068 | 6.0 | 21510 | 18 |
| 0.01 | 6.0 | 21474 | 16 |
| 0.017 | 6.0 | 15900 | 17 |
| 0.034 | 6.0 | 6400 | 22 |
| 0.05 | 6.0 | 3622 | 31 |
| 0.06 | 6.0 | 2967 | 25 |
| 0.068 | 6.0 | 2598 | 52 |
| 0.051 | 7.0 | 24618 | 41 |
| 0.0068 | 7.0 | 30270 | 21 |
| 0.010 | 7.0 | 18300 | 20 |
| 0.017 | 7.0 | 7926 | 16 |
| 0.034 | 7.0 | 5703 | 25 |
| 0.05 | 7.0 | 3573 | 33 |
| 0.06 | 7.0 | 3415 | 73 |
| 0.068 | 7.0 | 2243 | 45 |
| 0.0017 | 8.0 | 8298 | 3 |
| 0.0034 | 8.0 | 23604 | 9 |
| 0.0051 | 8.0 | 27252 | 17 |
| 0.0068 | 8.0 | 29058 | 22 |
| 0.01 | 8.0 | 16680 | 18 |
| 0.017 | 8.0 | 7480 | 14 |
| 0.05 | 8.0 | 2541 | 51 |
| 0.06 | 8.0 | 1807 | 36 |
| 0.0051 | 10.0 | 14760 | 15 |

TABLE I-continued

Etch rate and Selectivity as a Function of Dichromate and Acid Concentrations for $Al_{0.35}Ga_{0.65}As$ in the Presence of GaAs.

| Dichromate Conc. (Molar) | Acid Conc. (Molar) | Etch Rate (Å/30 min) | Selectivity |
|---|---|---|---|
| 0.0068 | 10.0 | 25680 | 23 |
| 0.01 | 10.0 | 10332 | 51 |

The Table shows large variations in etch rate and selectivity for different dichromate concentrations and acid concentrations. Optimum etch composition often depends on the nature of the application. For example, where high selectivity is desired, an etch solution composition near 0.06M (e.g. 0.05–0.1M) dichromate, 7M (e.g. 5–10M) phosphoric acid might be desirable; where high etch rate and only modest selectivity is desired, a composition near 0.007M (e.g. 0.003 to 0.015) dichromate and 7M (e.g. 3–10M) might be used.

The acid dichromate solution also etches other aluminum-containing III-V semiconducting compounds such as indium aluminum arsenide and also shows great selectivity in etching indium aluminum arsenide in the presence of indium gallium arsenide. For example, for 0.06M $K_2Cr_2O_7$ in 7M $H_3PO_4$ etches $In_{0.53}Al_{0.47}As$ at a rate of 340 Å/min while etching $In_{0.53}Ga_{0.47}As$ at less than 7 Å/hr for a selectivity of greater than 2900.

Etching procedures carried out in dichromate solutions with sulfuric acid also yielded excellent etch rates. Etch rates of 2000 to 12,000 Å in a 10 minute period are obtained with 1–60 millimolar dichromate in 2M sulfuric acid. Good selectivities are also obtained, often in the range from 5 to 10.

A variety of conventional procedures may be used to carry out the etching process. Generally, wetting the surface to be etched with the etching solution, is sufficient to achieve etching. Spraying the solution onto the surface to be etched is particularly convenient. Also, immersion in the etching solution yields excellent results. Stirring the solution insures greater etching uniformity over the surface being etched (e.g. a semiconductor wafer) and rapidly replaces spent etching solution close to the surface. Also, both with the spray procedure and immersion procedure, spinning the surface around the axis perpendicular to the surfaces insures highly uniform etch rates.

Another advantage of the acid dichromate etch is that this etch does not attack gold. Thus, etching can be carried out on semiconductor structures with gold electrodes. Of much greater importance is the fact that gold electrodes and the acid dichromate solution can be used to make self-aligned type structures using the gold electrode as an etch mask.

We claim:

1. A process for fabricating a device, said device comprising an aluminum containing III-V semiconducting compound comprising the step of etching said aluminum-containing III-V semiconductor compound in an etching solution characterized in that the etching solution comprises dichromate ion in an acidic aqueous solution in which the acid is selected from the group consisting of sulfuric acid and phosphoric acid.

2. The process of claim 1 in which the acid is phosphoric acid.

3. The process of claim 1 in which the concentration of dichromate ion is between 0.0001M and saturation.

4. The process of claim 3 in which the concentration of dichromate ion is between 0.001 and 0.5M.

5. The process of claim 2 in which the acid concentration is between 0.10 and 10M.

6. The process of claim 1 in which the aluminum containing III-V semiconducting compound is selected from the group consisting of aluminum gallium arsenide, aluminum indium arsenide and aluminum arsenide.

7. The process of claim 6 in which aluminum gallium arsenide is etched in the presence of gallium arsenide.

8. The process of claim 6 in which aluminum indium arsenide is etched in the presence of gallium indium arsenide.

9. The process of claim 1 in which the etching process takes place in the presence of a gold electrode.

* * * * *

UNITED STATES PATENT AND TRADEMARK OFFICE
CERTIFICATE OF CORRECTION

PATENT NO. : 4,923,564

DATED : May 8, 1990

INVENTOR(S) : Jaya Bilakanti and Edward J. Laskowski

It is certified that error appears in the above-identified patent and that said Letters Patent is hereby corrected as shown below:

Column 6, line 19 after "solution" insert --CHARACTERIZED IN THAT the etching solution--

Signed and Sealed this

Seventeenth Day of December, 1991

Attest:

HARRY F. MANBECK, JR.

Attesting Officer

Commissioner of Patents and Trademarks